United States Patent [19]

Nakamichi

[11] Patent Number: 5,072,787
[45] Date of Patent: Dec. 17, 1991

[54] FINNED HEAT SINK

[75] Inventor: Niro Nakamichi, Tokyo, Japan

[73] Assignee: Nakamichi Corporation, Tokyo, Japan

[21] Appl. No.: 573,674

[22] Filed: Aug. 27, 1990

[30] Foreign Application Priority Data

Aug. 30, 1989 [JP] Japan ................................ 101387[U]

[51] Int. Cl.5 .............................................. F28F 13/00
[52] U.S. Cl. .................................. 165/80.3; 165/146; 165/185; 361/384
[58] Field of Search ...................... 165/80.3, 146, 147, 165/185; 361/384, 386

[56] References Cited

U.S. PATENT DOCUMENTS

| 3,817,321 | 6/1974 | von Cube | 165/105 |
| 4,103,737 | 8/1978 | Perkins | 165/80 |
| 4,765,397 | 8/1988 | Chrysler et al. | 165/104.33 |
| 4,953,634 | 9/1990 | Nelson et al. | 165/147 |

Primary Examiner—Allen J. Flanigan
Attorney, Agent, or Firm—Pearne, Gordon, McCoy & Granger

[57] ABSTRACT

A radiator comprising a radiating block including a hollow air path through which cooling air flows, outer cooling faces on which a plurality of heated bodies to be cooled are mounted, and a plurality of cooling fins disposed within the hollow air path so as to engage inner faces of the radiating block wherein the cross-sectional cooling areas vary along the air flow path.

13 Claims, 5 Drawing Sheets

FINNED HEAT SINK

BACKGROUND OF THE INVENTION

Various radiators have been proposed for cooling heated bodies such as power transistors.

One of the prior radiators has a cooling air flow path in which a plurality of heated bodies having cooling fins are disposed. In such radiators, the cooling fins have radiating surfaces which increase in size from the upstream cooling fin to the downstream cooling fin along the direction of cooling air flow.

However, in such prior art, the heated bodies require cooling fins having cooling areas different from each other and the radiator is required to have a hollow portion defined by the cooling air path. This results in a complicated construction which is expensive to manufacture.

SUMMARY OF THE INVENTION

Accordingly, it is a principal object of the invention to provide a radiator having simple cooling fins adapted to effectively cool heated bodies.

It is another object of the invention to provide an easily assembled radiator of simple construction.

In accordance with one aspect of the present invention, there is provided a radiator for cooling a plurality of power transistors or other heat generating components with a flow of cooling air comprising:

first through fourth side walls, two of which are faced in parallel to each other and positioned so as to form a hollow portion having a quadrilateral cross section and two openings;

a plurality of cooling fins, each formed from a rectangular plate member having a notch formed along lines connecting each of two points on one of the short sides of said rectangular plate member, the two points being positioned at equal distances from a reference line dividing said rectangular plate member in a direction parallel to the long sides of said rectangular plate member, to a point on said reference line at a distance from said short side which is shorter than a length of said long side of said rectangular plate member;

said cooling fins disposed so that said long sides of said rectangular plate members are positioned in a direction parallel to a longitudinal direction of said hollow portion and so that said one short side of each of said rectangular plate members is positioned at one of said two openings with said respective long sides of said rectangular plate members being engaged with one face of each of said third and fourth side walls facing each other;

and another face of each of said third and fourth side walls forming an engagement face which thermally engages said plurality of heated bodies mounted thereon in a longitudinal direction of said long sides of said rectangular plate member while said cooling air flows through said openings.

In accordance with another aspect of the present invention, there is provided a radiator for cooling a plurality of power transistors or other heat-generating components with a flow of cooling air comprising:

first through fourth side walls, two of which are faced in parallel to each other and positioned so as to form a hollow portion having a quadrilateral cross section and two openings;

a plurality of cooling fins, each formed from a rectangular plate member having a notch extending from one point on one of the short sides of said rectangular plate member to one point on one of the long sides of said rectangular plate member;

said cooling fins disposed so that said long sides of said rectangular plate member are positioned in a direction parallel to a longitudinal direction of said hollow portion and so that said one short side of said rectangular plate member is positioned at one of said two openings with another long side of said rectangular plate member being engaged with one face of said third side wall;

and another face of said third side wall forming an engagement face which thermally engages said plurality of heated bodies mounted thereon in a longitudinal direction of said long sides of said rectangular plate member while said cooling air flows through said one opening.

In accordance with a further aspect of the present invention, there is provided a radiator for cooling a plurality of heated bodies by a cooling air comprising:

first through fourth side walls, two of which are faced in parallel to each other and positioned so as to form a hollow portion having a quadrilateral cross section and two openings;

a plurality of opposing cooling fins each formed from a rectangular plate member having a notch extending from one point on one of the short sides of said rectangular plate member to one point on the long side of said rectangular plate member opposite the long side associated with said side wall;

a first group of said cooling fins disposed at equal distance so that said long sides of said rectangular plate member are positioned in a direction parallel to a longitudinal direction of said hollow portion and so that said one short side of said rectangular plate member is positioned at one of said two openings with another long side of said rectangular plate member being engaged with one face of said third side wall;

a second group of said cooling fins disposed at equal distance so that said long sides of said rectangular plate member are positioned in a direction parallel to a longitudinal direction of said hollow portion and so that said one short side of said rectangular plate member is positioned at one of said two openings with another long side of said rectangular plate member being engaged with one face of said fourth side wall facing said third side wall;

said first and second groups of said cooling fins being spaced at a predetermined distance;

and another face of each of said third and fourth side walls forming an engagement face which thermally engages said plurality of heated bodies mounted thereon in a longitudinal direction of said long sides of said rectangular plate member while said cooling air flows through said one opening.

BRIEF DESCRIPTION OF THE DRAWINGS

Other objects and features of the invention will be apparent from the description of the embodiments of the invention taken along with the accompanying drawings in which.

DETAILED DESCRIPTION OF THE EMBODIMENTS

Figures 1, 2:
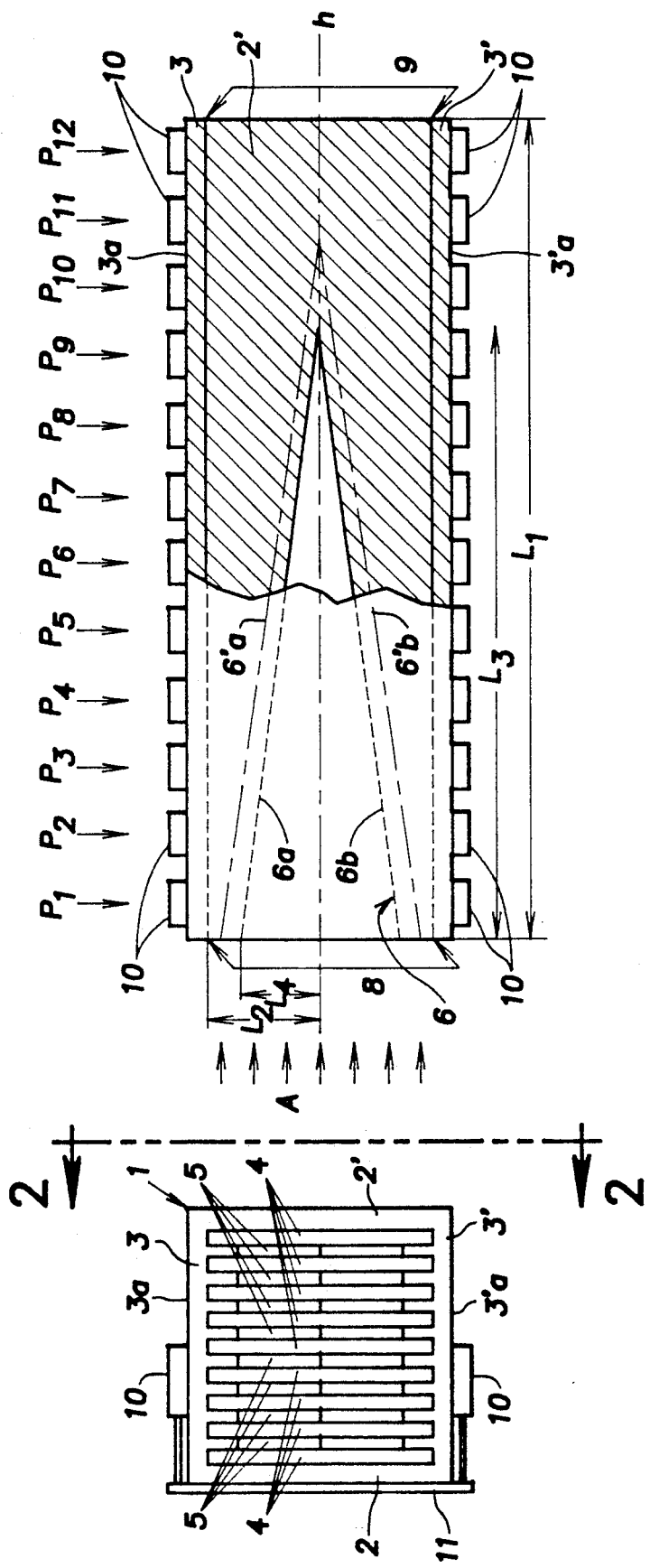
FIG. 1 is a top plan view of a radiator constructed in accordance with an embodiment of the invention.
FIG. 2 is a side elevation view, partly in section, taken on line 2—2 of FIG. 1.

Referring to FIGS. 1 and 2, there is shown a radiator constructed in accordance with one embodiment of the invention.

The radiator comprises a radiating block 1 having rectangular side faces and a quadrilateral cross section. The radiating block 1 has a hollow portion defined by four walls 2, 2', 3 and 3'. Cooling air paths 4 are separated from each other by a plurality of cooling fins 5 which extend through the hollow portion along its longitudinal direction.

The plurality of cooling fins 5 are formed of a rectangular plate member having a predetermined thickness and disposed in a direction parallel to the right and left side walls 2 and 2', and are equally spaced apart from one another. The respective cooling fins 5 have a V-shaped notch 6 defined by upward and downward edges 6a and 6b, as indicated in FIG. 2. As noted from FIG. 2, the notch 6 is formed so that its width becomes narrower in a direction from an inlet opening 8 to an outlet opening 9.

Cooling air which flows through the radiating block 1 from the inlet opening 8 and out of the outlet opening 9 cools the radiating block 1. The cooling air passes through the cooling air paths.

A plurality of power transistors 10 which are to be cooled are mounted on outer faces 3a and 3'a of the upper and lower walls 3 and 3' of the radiating block 1 and are spaced apart from one another at a predetermined distance along a longitudinal direction. The power transistors 10 have respective heating faces thermally bonded to the outer faces 3a and 3'a of the upper and lower walls 3 and 3'. In FIG. 1, a reference numeral 11 designates a printed board to which respective terminals of the power transistors 10 are soldered.

Figure 7:
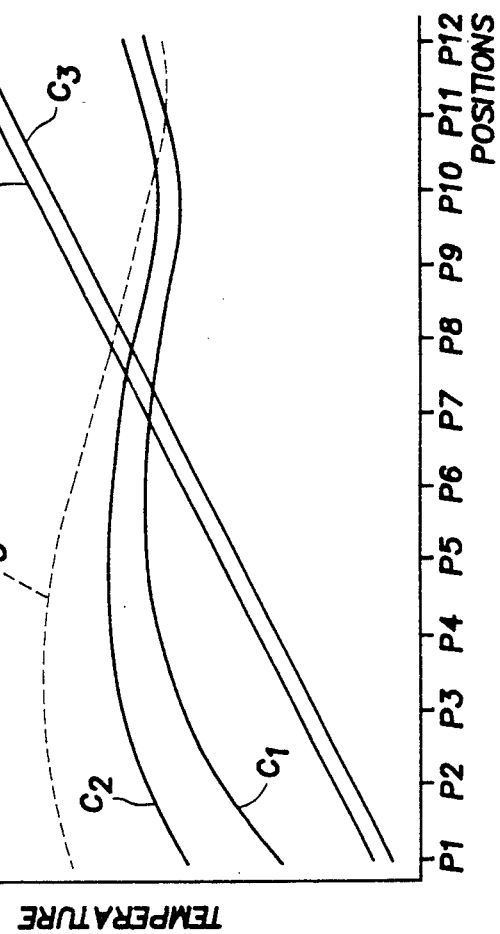
FIG. 7 illustrates thermal characteristics of a plurality of heated bodies positioned at various points of radiators.
Figure 8:
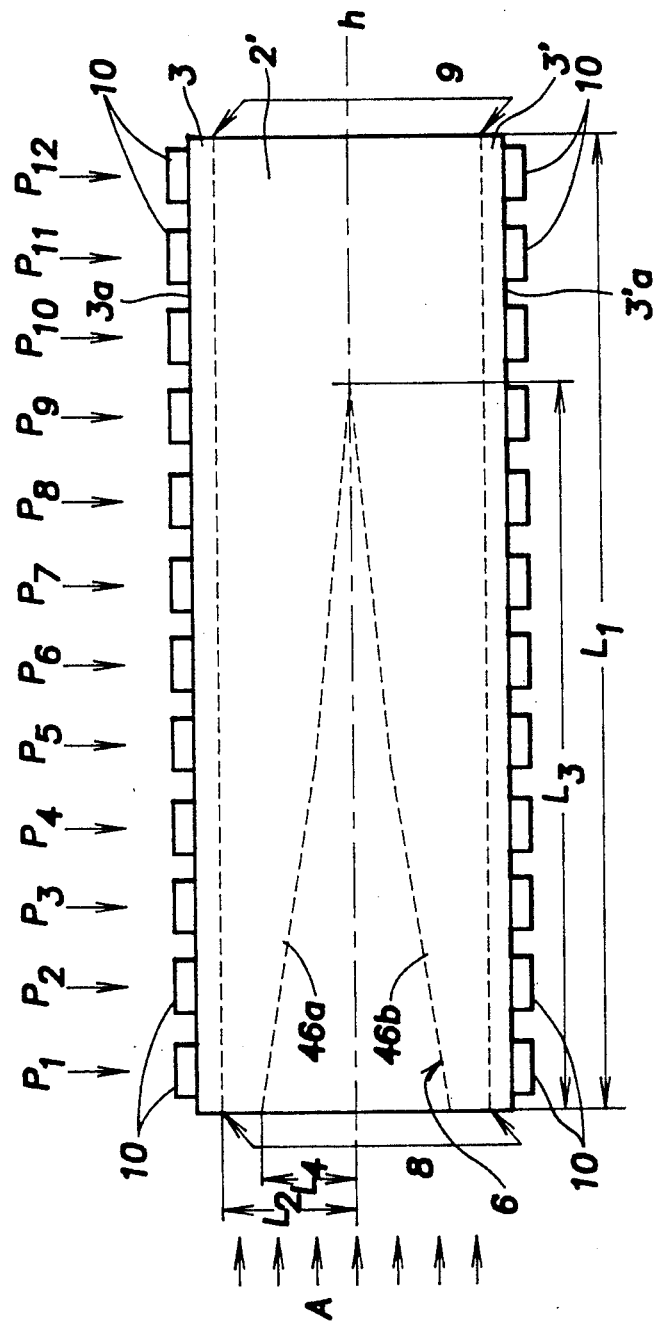
FIG. 8 is a side elevation view of another embodiment of the invention.
Figure 9:
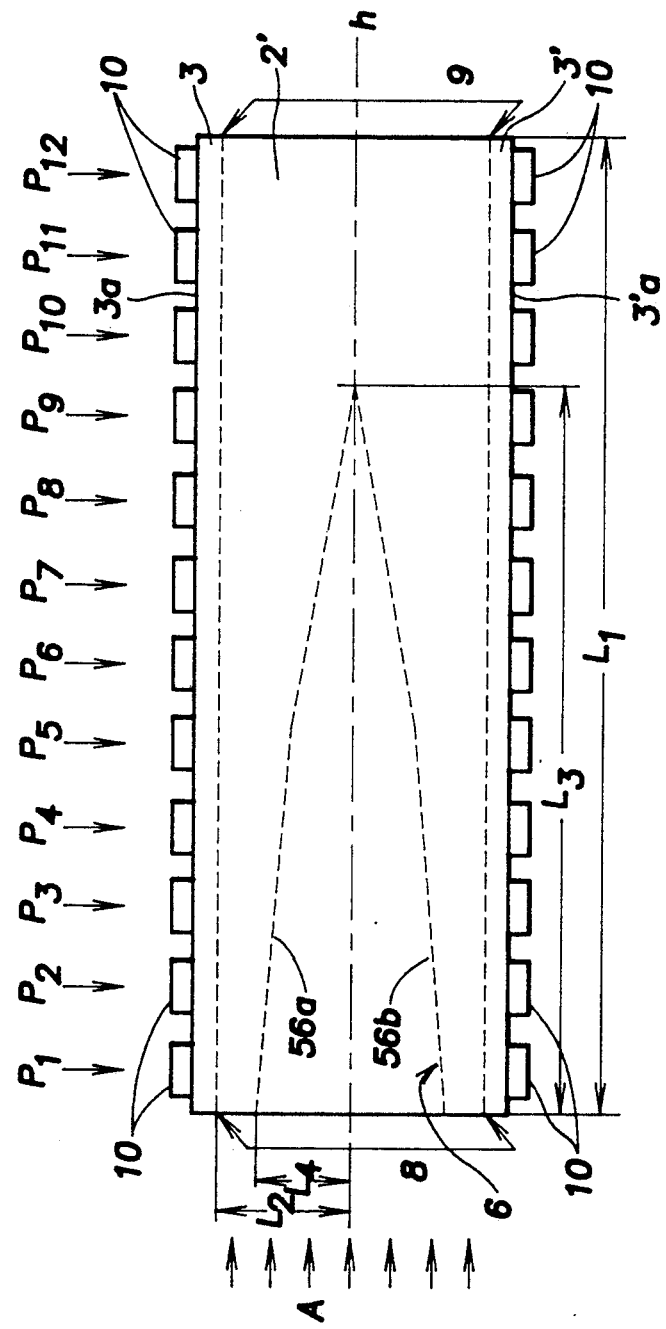
FIG. 9 is a side elevation view of a further embodiment of the invention.

When cooling air is introduced into the inlet opening 8 in a uniform manner as indicated by arrows A of FIG. 2, the radiating block 1 has a temperature profile as indicated by a line $C_2$ of FIG. 7, while the cooling air has a temperature profile as indicated by a line $C_1$ of FIG. 7. These temperature profiles represent radiating systems in which the power transistors 10 each generate the same amount of heat. The line $C_2$ indicates thermal variation in the radiating block 1 obtained by an average temperature at the respective positions $P_1$ through $P_{12}$ of FIG. 2, while the line $C_1$ indicates thermal variation in the cooling air obtained by an average temperature at the respective positions $P_1$ through $P_{12}$ where the cooling air contacts with the cooling fins 5.

In FIG. 7, lines $C_4$ and $C_3$ indicate the temperature profiles of the radiating block 1 and the cooling air, respectively, when the cooling fins 5 have uniform rectangular side faces without any notches. As noted from the line $C_3$ if FIG. 7, the temperature of the cooling air entering the inlet opening 8 increases as it advances through the cooling air paths toward the outlet opening 9 where the temperature of the cooling air reaches a maximum. Accordingly, the temperature of the radiating block 1 cooled by the cooling air varies in a similar manner. More particularly, the temperature of the radiating block 1 becomes higher from the position $P_1$ to the position $P_{12}$ at an approximate rate as indicated by the line $C_4$ of FIG. 7.

Obviously, since heat is being transferred from the fins to the air, the temperatures of the radiating block 1 at the respective positions $P_1$ through $P_{12}$ are higher than those of the cooling air at the corresponding positions.

When the cooling fins 5 are cut so as to form the V-shaped notch 6, the cooling air has a temperature profile in which the temperature of the cooling air rapidly increases immediately after it enters the inlet opening 8, gradually decreases as it advances through the cooling air paths, and again increases as it further advances. This is because the cooling fins 5 have a larger radiating area toward the downstream position and a correspondingly smaller cross-sectional area available for flow of cooling air. As noted from the line $C_2$, the temperatures of the radiating block 1 at the respective positions vary in accordance with the variation in the temperatures of the cooling air as indicated by the line $C_1$ of FIG. 7. The temperatures of the radiating block 1 at the respective positions are higher than those of the cooling air at the corresponding positions, with the difference between them depending on the cooling efficiency which is based on the radiating areas of the cooling fins 5 at the respective positions.

As apparent from FIG. 7, the radiating block 1 has a lower maximum temperature because the heat is more evenly distributed through the total radiating volume of the radiating block 1.

Variations in the temperatures of the radiating block 1 at the respective positions change in accordance with the configuration of the notch in the cooling fins 5. For example, if the notch in the cooling fins 5 is more deepened as indicated by dot and chain lines 6'a and 6'b of FIG. 2, the temperatures of the radiating block 1 at the respective positions vary as indicated by the dotted line $C_5$ of FIG. 7. In this case, the total radiating volume of the radiating block 1 further decreases while its maximum temperature becomes higher.

It will be noted that the radiator of the invention is adapted so as to optimize the dimensions of the V-shaped notches in the cooling fins 5 so that the maximum temperature of the radiating block 1 becomes as low as possible.

In a simulation test, with radiating block 1 having a plane symmetry relative to a reference plane h, as shown in FIG. 2, the best result has been obtained by approximately setting as 3/2 a ratio of a distance $L_2$ from the reference plane h to outer edges of the cooling fins 5, relative to a distance $L_4$ from the reference plane h to the edge of the notch 6 in the cooling fins 5, while a ratio of an entire length $L_1$ of the radiating block 1 relative to a length $L_3$ of the notches 6 is approximately set as 4/3. It will be noted that this ratio can be properly set in accordance with the disposal conditions of the heated bodies 10 to be cooled. For example, the distance $L_2$ may be equal to the distance $L_4$.

Figures 3, 4:
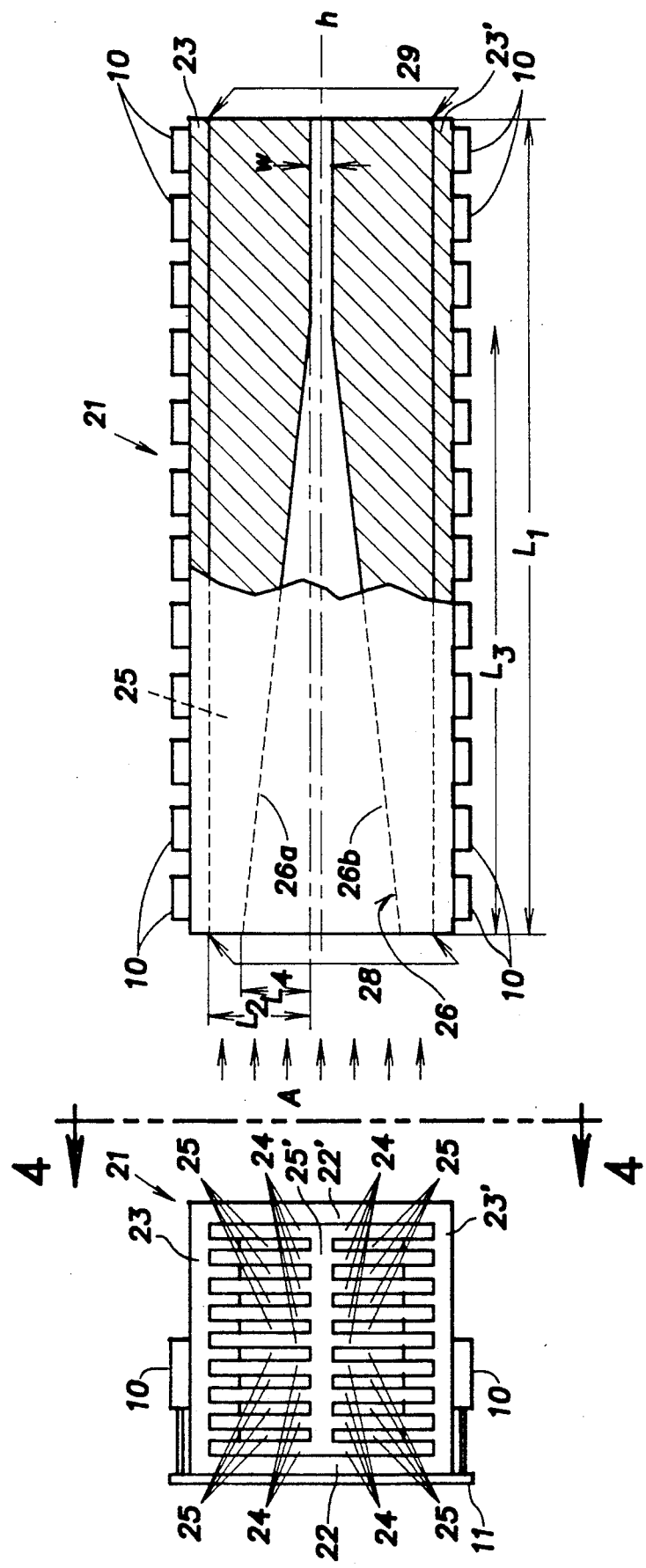
FIG. 3 is a top plan view of a radiator constructed in accordance with another embodiment of the invention.
FIG. 4 is a side elevation view, partly in section, taken on line 4—4 of FIG. 3.

FIGS. 3 and 4 show a radiator constructed in accordance with another embodiment of the invention. The radiator of FIGS. 3 and 4 comprises a radiating block 21 substantially identical to the radiating block 1 of FIGS. 1 and 2, but respective pairs of cooling fins 25 and 25 are provided so that they are separated by a predetermined distance w while they have a plane symmetry relative to the reference plane h. Thus, it will be noted that a cooling air entering an inlet opening 28 passes through an air flowing path 24 and also through a central air flowing path 25' which is additionally defined by the pairs of cooling fins 25 and 25. In FIGS. 3 and 4, reference numerals 22, 22', 23, and 23' designate side walls of the radiating block 21, while reference numerals 28 and 29 designate inlet and outlet openings, respectively.

Figure 6:
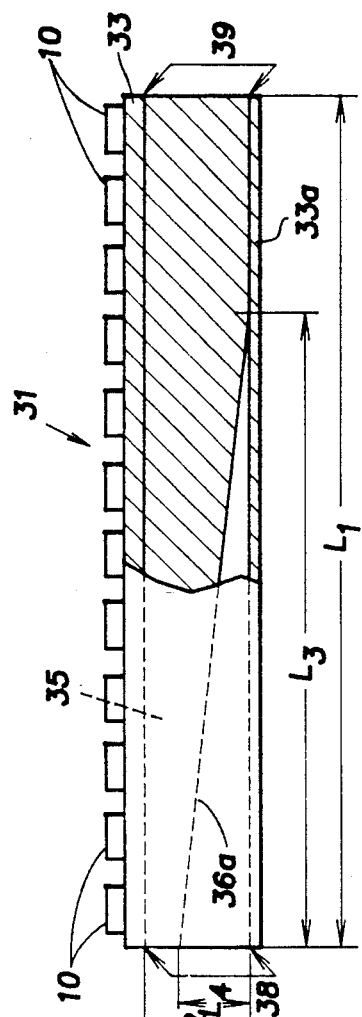
FIG. 6 is a side elevation view, partly in section, taken on line 6—6 of FIG. 5.
Figure 5:
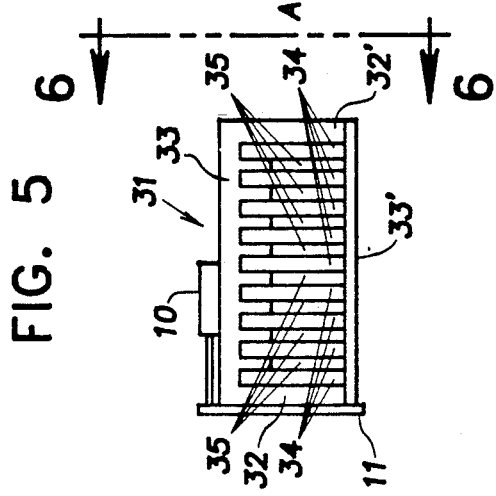
FIG. 5 is a top plan view of a radiator constructed in accordance with a further embodiment of the invention.

FIGS. 5 and 6 show a radiator constructed in accordance with a further embodiment of the invention. The radiator comprises a radiating block 31 formed of a body corresponding to one-half of the radiating block 1 of FIGS. 1 and 2 which is obtained by dividing the radiating block 1 along the reference plane h. A lower wall 33a of the radiating block 31 may be formed of thermally insulating material because none of the heated bodies 10 are mounted thereon as shown in FIGS. 5 and 6. In FIGS. 5 and 6, reference numerals 32, 32' and 33 designate side walls of the radiating block 31 while reference numerals 38 and 39 designate inlet and outlet openings, respectively.

It should be noted that configurations of the cooling fins of FIGS. 3, 4, 5, and 6 may be preferably determined in the same manner as that of FIGS. 1 and 2.

It will be understood that since the temperatures of the radiator at the respective positions are averaged, the maximum temperature of the radiator can be lowered. In addition thereto, since the heated bodies to be cooled are mounted on the outer faces of the radiator, they can be more easily mounted thereon.

Although some embodiments of the invention have been described and illustrated with reference to the accompanying drawings, it will be understood by those skilled in the art that they are by way of examples, and that various changes and modifications may be made without departing from the spirit and scope of the invention. For example, the respective cooling fins 1 of FIGS. 1 and 2 need not be single pieces, but may be divided along the reference plane h and bonded to each other by any suitable means. Furthermore, the right and left side walls 2 and 2' may be separately formed and bonded to each other by any suitable means. Also, they may be formed of thermally insulating materials. Thus, it will be noted that the right and left side walls 2 and 2' may be formed of printed board to which the power transistors 10 as the heated bodies are connected. Although the edges of the notches in the cooling fins 5, 25 and 35 are straightly formed, they may be formed as curved edges 46a and 46b or folded straight-line edges 56a, 56b, or in accordance with the disposal and thermal conditions of the heated bodies. Thus, it will be noted that the invention is defined only by the appended claims.

What is claimed is:

1. A radiator for cooling a plurality of power transistors using a flow of cooling air comprising:
   first through fourth side walls including exterior and interior surfaces, said side walls also having longitudinal edges joined so that said interior surfaces form a hollow portion of quadrilateral cross section which extends between opposed inlet and outlet end openings for the passage of cooling air;
   a plurality of power transistors disposed adjacent exterior surfaces of an opposed pair of sidewalls for transfer of heat to the radiator, said power transistors including terminals adapted to be connected to an electrical circuit board disposed adjacent an exterior surface of a side wall extending between said opposed side walls; and
   a plurality of spaced elongate cooling fins disposed within said hollow portion and having length and width dimensions, each of said cooling fins having its length extending longitudinally within said hollow portion and its width extending between the interior surfaces of said opposed side walls associated with said power transistors, said cooling fins providing substantially V-shaped notches which open toward said inlet opening with each leg of said substantially V-shaped notches being associated with one of said opposed side walls.

2. A radiator as set forth in claim 1, wherein said substantially V-shaped notches are provided by substantially wedge-shaped opposing pairs of fins with the opposing fins being spaced apart from one another to also provide a narrow linear channel extending from the apex of said substantially V-shaped notch toward the outlet opening of said hollow portion.

3. A radiator as set forth in claim 1, wherein the open end of each of said substantially V-shaped notches is about two-thirds of the width of said fins, and the depth of each of said substantially V-shaped notches is about three-fourths of the length of said fins.

4. A radiator as set forth in claim 2, wherein the open end of each of said substantially V-shaped notches is about two-thirds of the width of said fins, and the depth of each of said substantially V-shaped notches is about three-fourths of the length of said fins.

5. A radiator as set forth in claim 1, wherein each of said legs of said substantially V-shaped notches in said cooling fins is straight.

6. A radiator as set forth in claim 1, wherein each of said legs of said substantially V-shaped notches in said cooling fins is curved.

7. A radiator as set forth in claim 1, wherein each of said legs of said substantially V-shaped notches in said cooling fins is bent at a predetermined angle.

8. A radiator as set forth in claim 2, wherein each of said legs of said substantially V-shaped notches in said cooling fins is curved.

9. A radiator as set forth in claim 2, wherein each of said legs of said substantially V-shaped notches in said cooling fins is curved.

10. A radiator as set forth in claim 2, wherein each of said legs of said substantially V-shaped notches in said cooling fins is bent at a predetermined angle.

11. A radiator for cooling a plurality of power transistors using a flow of cooling air comprising:
    first through fourth side walls including exterior and interior surfaces, said side walls also having longitudinal edges joined so that said interior surfaces form a hollow portion of quadrilateral cross section which extends between opposed inlet and outlet end openings for the passage of cooling air;
    a plurality of power transistors disposed adjacent exterior surfaces of an opposed pair of side walls for transfer of heat to the radiator; and
    a plurality of spaced elongate cooling fins disposed within said hollow portion and having length and width dimensions, each of said cooling fins having its length extending longitudinally within said hollow portion and its width extending between the interior surfaces of said opposed side walls associated with said power transistors, said cooling fins providing substantially V-shaped notches which open toward said inlet opening with each leg of said substantially V-shaped notches being associated with one of said opposed side walls;

wherein the open end of each of said substantially V-shaped notches is about two-thirds of the width of said fins, and the depth of each of said substantially V-shaped notches is about three-fourths of the length of said fins.

12. A radiator for cooling a plurality of power transistors using a flow of cooling air comprising:

first through fourth side walls including exterior and interior surfaces, said side walls also having longitudinal edges joined so that said interior surfaces form a hollow portion of quadrilateral cross section which extends between opposed inlet and outlet end openings for the passage of cooling air;

a plurality of power transistors disposed adjacent exterior surfaces of an opposed pair of side walls for transfer of heat to the radiator;

a plurality of spaced elongate cooling fins disposed within said hollow portion and having length and width dimensions, each of said cooling fins having its length extending longitudinally within said hollow portion and its width extending between the interior surfaces of said opposed side walls associated with said power transistors, said cooling fins providing substantially V-shaped notches which open toward said inlet opening with each leg of said substantially V-shaped notches being associated with one of said opposed side walls;

wherein said substantially V-shaped notches are provided by substantially wedge-shaped opposing pairs of fins with the opposing fins being spaced apart from one another to also provide a narrow linear channel extending from the apex of said substantially V-shaped notch toward the outlet opening of said hollow portion; and wherein the open end of each of said substantially V-shaped notches is about two-thirds of the combined width of a pair of said opposing fins, and the depth of each of said substantially V-shaped notches, exclusive of said narrow linear channel, is about three-fourths of the length of said fins.

13. A radiator for cooling a plurality of power transistors using a flow of cooling air comprising:

first through fourth side walls including exterior and interior surfaces, said side walls also having longitudinal edges joined so that said interior surfaces form a hollow portion of quadrilateral cross section which extends between opposed inlet and outlet end openings for the passage of cooling air;

a plurality of power transistors disposed adjacent an exterior surface of a side wall for transfer of heat to the radiator;

a plurality of spaced elongate cooling fins disposed within said hollow portion and having length and width dimensions, each of said cooling fins having its length extending longitudinally within said hollow portion and its width extending between the interior surface of said side wall associated with said power transistors and an opposing side wall, each of said cooling fins being formed from a substantially rectangular plate having a triangular notch, the legs of said notch defined by a straight inclined edge in said plate and the side wall opposite the side wall associated with said power transistors, the opening of said notch being associated with said inlet opening, said opening being about two-thirds of the width of said plate at the side associated with said outlet opening, and the length of said leg of said notch associated with said side wall opposite the side wall associated with said power transistors being about three-fourths of the length of said plate on the side wall associated with said power transistors.

* * * * *